United States Patent [19]

Vreeken et al.

[11] Patent Number: 4,689,577
[45] Date of Patent: Aug. 25, 1987

[54] CIRCUIT FOR SYNCHRONIZING AN OSCILLATOR TO A PULSE TRAIN

[75] Inventors: Roelof Vreeken; Edmond De Niet; Albert M. A. Rijckaert, all of Eindhoven, Netherlands

[73] Assignee: U.S. Philips Corporation, New York, N.Y.

[21] Appl. No.: 735,901

[22] Filed: May 20, 1985

[30] Foreign Application Priority Data

May 22, 1984 [NL] Netherlands .......................... 8401629

[51] Int. Cl.⁴ ............................................. H03K 5/22
[52] U.S. Cl. ...................................... 328/155; 328/55; 328/63; 328/72; 307/471; 307/269; 307/514; 307/527
[58] Field of Search ..................... 328/155, 55, 63, 72; 331/1 A, 1 R; 307/514, 516, 528, 272 A, 272 R, 269, 471, 526, 527, 518; 371/47, 57, 61, 62

[56] References Cited

U.S. PATENT DOCUMENTS

| 3,755,748 | 8/1973 | Carlow et al. | 328/72 |
| 3,950,705 | 4/1976 | Fuerherm | 307/471 |
| 4,222,009 | 9/1980 | Moulton et al. | 328/72 |
| 4,313,206 | 1/1982 | Woodward | 328/63 |
| 4,422,176 | 12/1983 | Summers | 375/120 |
| 4,473,805 | 9/1984 | Guhn | 307/526 |
| 4,544,850 | 10/1985 | Tarleton | 307/272 A |

FOREIGN PATENT DOCUMENTS

| 99826 | 7/1980 | Japan | 307/471 |
| 2089601A | 6/1982 | United Kingdom . | |
| 2091961A | 8/1982 | United Kingdom | 328/155 |

Primary Examiner—Stanley D. Miller
Assistant Examiner—Karl Ohralik
Attorney, Agent, or Firm—David R. Treacy

[57] ABSTRACT

In an arrangement comprising a phase control circuit the phase comparator, when receiving input pulses with which the clock pulses are in phase, will produce an output signal having a pulse frequency which is twice the pulse frequency of the input pulses. The ripple on the control-voltage for the oscillator to be controlled resulting therefrom is compensated for by adding to the output signal of the phase detector a signal which is opposite in phase to the output signal. The result is that only frequency- and phase errors produce a ripple (change) on the output signal.

8 Claims, 7 Drawing Figures

CIRCUIT FOR SYNCHRONIZING AN OSCILLATOR TO A PULSE TRAIN

BACKGROUND OF THE INVENTION

The invention relates to a phase control-circuit comprising at least one voltage-controlled oscillator and a phase comparator, in which an output of the oscillator is connected at least indirectly to a clock input of the phase comparator for feeding thereto clock pulses produced by the oscillator, said phase comparator being provided with a further input for receiving input pulses, the phase comparator producing from said clock pulses and input pulses a control-signal for the voltage-controlled oscillator.

Such an electric circuit arrangement is known from GB-A No. 2,089,601 published on June 23, 1982, to which U.S. Pat. No. 4,422,176 corresponds. The electric circuit arrangement shown therein has the property that it does not produce a ripple-free direct voltage even though the clock signal and a data signal to be received are in phase. Consequently, an oscillator controlled by the direct voltage signal will generate a frequency which will always exhibit some undesirable drift.

SUMMARY OF THE INVENTION

The invention has for its object to provide a circuit arrangement having a phase control citcuit which gives off a ripple-free control-voltage when the clock and the data signals are in phase.

According to a first embodiment of the invention, a phase control circuit is characterized in that the phase comparator comprises a D-type flipflop, a pulse delaying element and an exclusive-OR gate, said pulse delaying element having a delay time of about half a clock period. A first and a second input respectively of the exclusive-OR gate are connected to the output of the pulse delaying element and to the D flipflop respectively. The clock pulses are applied to the clock input of the D flipflop, and the input pulses are applied both to the pulse delaying element and to the D input of the D flipflop. The output of the exclusive-OR gate is connected to an input of a combinatory network which also receives the clock pulses at a further input to form a first and a second output signals whose logical values are opposite when the clock pulses and the input pulses are in phase. When the clock pulses are leading or lagging respectively with respect to the input pulses, the two signals both have the same pulsatory first and second logical values respectively.

In such an arrangement, simple means such as a pulse delaying element (not clock controlled), a D flipflop, an exclusive-OR gate and a combinatory network provide a phase comparator which supplies a direct voltage, when the clock pulses and the input pulses are in phase (the input pulses need not necessarily in regular periods) and which varies it stepwise, under out-of-phase conditions, during the successive clock periods.

A preferred embodiment of the circuit arrangment described above is characterized in that the combinatory network comprises an inverting AND gate, a further AND gate and an inverter, in which a first input of the two AND gates is connected to the output of the exclusive-OR gate. The second inputs of the inverter and the AND gate respectively receive the clock pulses directly and via the inverter. The respective first and the second output signals are available at the outputs of the AND gates. A phase comparator of this design is very simple and fully satisfies the requirements imposed.

A second embodiment in accordance with the invention, which operates satisfactorily only when the input pulses form a regular periodic signal, is characterized in that the phase comparator comprises a D flipflop and an exclusive-OR gate, in which the clock pulses are applied to the clock input of the D flipflop, the output $\overline{Q}$ of which is connected from the inverted output signal $\overline{Q}$ to the D input. The output signal Q is connected to a first input of the exclusive-OR gate. The second input receives the input pulses. Thus at the output of the exclusive-OR gate and the input of the clock pulses a first and a second output signal respectively are available, the logical values of which are opposite when the clock pulses and the input pulses are in phase. When the clock pulses are leading or lagging respectively with respect to the input pulses, during part of each clock cycle the two signals pulsatorily have the same (first or second respectively) logical value.

The invention will be described more fully with reference to embodiments shown in the drawing.

DESCRIPTION OF THE PREFERRED EMBODIMENTS

Figure 1A:
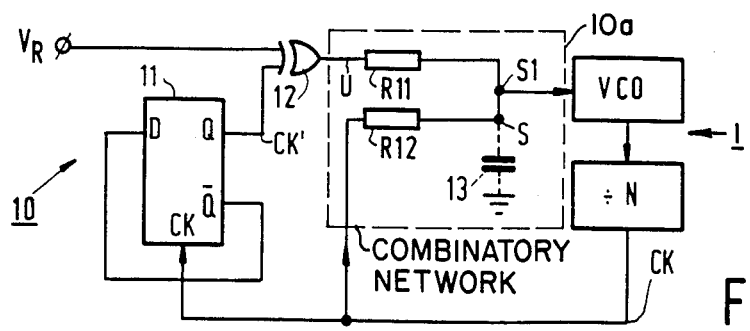
FIG. 1a and 1b are a block diagram of a circuit arrangment in accordance with the invention and an associated pulse diagram.

FIG. 1a shows a circuit arrangement 1 according to the second embodiment described above, comprising a phase comparator 10 in accordance with the invention. The circuit 1 comprises a known voltage controlled oscillator VCO and a frequency divider N which receives the oscillator pulses produced by the oscillator VCO. The divider N produces clock pulses CK of a lower frequency, which are applied to a clock pulse input of the phase comparator 10.

This lower frequency, of the clock pulses CK, is exactly twice the frequency of the input pulses $V_R$ to which the higher frequency oscillator VCO is to be synchronized. Of course, a VCO of frequency CK could be used, in which case the divider N would not be needed.

The comparator 10 comprises a D-type flipflop 11 which receives the clock pulses CK and has its inverted output $\overline{Q}$ connected to the D input in order to produce a pulse train CK' of a pulse frequency amounting to half the pulse frequency of the clock pulses CK. Thus the CK' train has a frequency equal to that of the input pulses $V_R$. The clock pulses CK and the pulse sequences CK' derived therefrom are represented in FIG. 1b.

The output Q of the D flipflop 11 is connected to an input of an exclusive-OR gate 12, the second input of which receives input pulses Vr (which must form a regular periodic signal). By operation of a combinatory network 10a producing a control signal S, the oscillator VCO is brought to the desired frequency and in the desired phase and maintained therein.

Figure 1B:
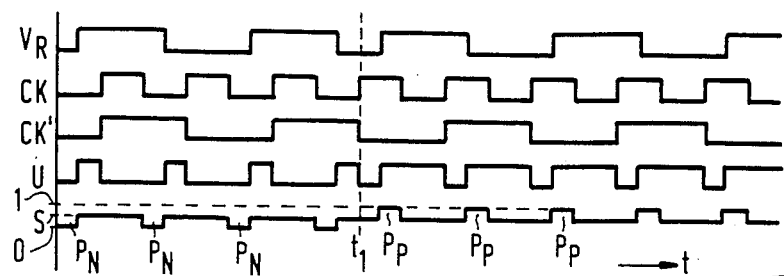

The output signal U of the exclusive-OR gate 12 is shown in FIG. 1b for two situations as a function of time t. Before instant $t_1$ the oscillator VCO is leading (the pulses CK are "too early") and after the instant $t_1$ the oscillator VCO is lagging (the pulses CK are "too late").

That is, as will be made clear by the operation of the entire circuit described below, the output of higher frequency oscillator VCO should have such a phase relationship with respect to the input pulse train $V_r$ that the leading edge (left) of each "0" of CK coincides with the leading edge of a "0" or a "1" of $V_r$. When this desired relationship exists, the train CK' will lag the train $V_r$ by exactly half of a pulse width, and the signal U will then be exactly opposite the signal CK.

Thus, the divider N, combinatory network 10a and D-type flipflop function as a pulse-delaying element which produces pulses CK' which are delayed by half a pulse width behind the pulses $V_r$ when the oscillator VCO is synchronized.

The signal U before instant $t=t_1$ is predominantly a "0" level on which positive peaks "1" are superimposed. After the instant $t=t_1$ the signal U has a predominantly "1" level of which negative peaks are superimposed. The pulse frequency of the signal U is twice the frequency of the input pulses Vr. Then a ripple-free control-voltage can be generated (when the oscillator VCO is in phase) by adding the signal CK to the signal U. In the embodiment shown this is performed by applying the two signals U and CK as first and second signals of the combinatory network, through (preferably equal) resistors R11 and R12 to a junction S1. The resultant signal S is shown in FIG. 1b (as well as the signals Vr and U).

The consequence of the combination of the signals U and CK is that only frequency and phase errors can bring about a ripple on the control-voltage. (If the oscillator VCO is leading, the signal S consists of the superimposition of a direct-current signal level midway between the logical "0" and "1" levels and of a plurality of negative pulses $P_n$ having the same pulse frequency as the clock pulses CK and having a logical "0" level. If the oscillator VCO is lagging, the signal S consists of the same direct-current signal level on which positive pulses $P_p$ having the logical "1" level and the same pulse frequency as the clock pulses CK are superimposed). It will be obvious that the width of the pulses $P_n$ and $P_p$ depends on the magnitude of the phase difference between the input pulses Vr and the clock pulses CK generated by the oscillator VCO and the clock pulses CK produced by the divider N. As is common practice a capacitor 13 can be connected to the junction S1 so that on the junction S1 a mean voltage of the voltage S shown in FIG. 1 is formed for controlling the oscillator VCO.

Figure 2A:
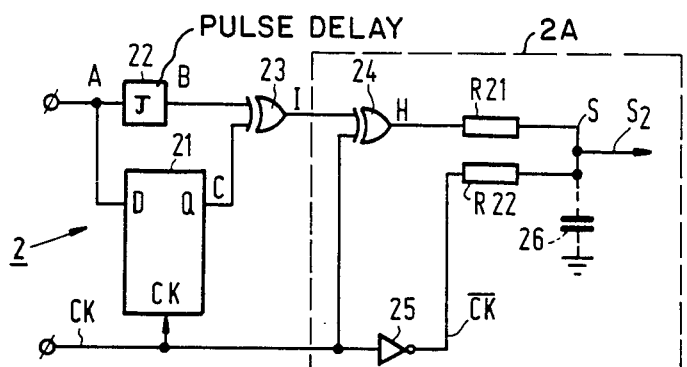
FIGS. 2a and 2b are a block diagram of a further embodiment with an associated pulse diagram in accordance with the invention.
Figure 2B:
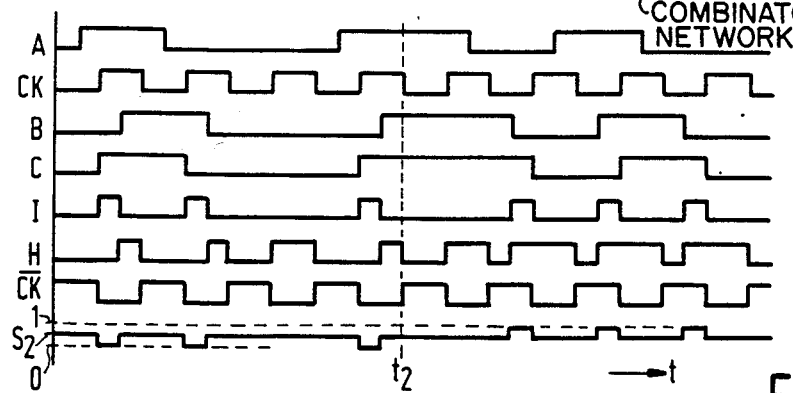

The circuit arrangment shown in FIG. 1a operates satisfactorily only when the input pulses Vr applied thereto form a regular, periodic signal. If the input pulses are not regularly periodic, a phase comparator 2 shown in FIG. 2a can be used in the circuit arrangment embodying the invention or modifications thereof as will be set out hereinafter. The phase comparator 2 shown in FIG. 2a comprises a pulse delaying element 22, a D type flipflop 21, a first and a second exclusive-OR gate 23 and 24, an inverter 25 and two (identical) resistors R21 and R22. The input pulses A (see FIG. 2b) are applied to the D input of the D type flipflop 21 and to the pulse delaying element 22. The delay of the signal A in the element 22 is substantially equal to half the period of the clock pulse CK applied to the clock input of the D flipflop 21. The output signal B of the element 22 and the output signal C of the D flipflop 21 are applied to the first exclusive-OR gate 23, which forms a signal I therefrom (see FIG. 2b).

The signal I as well as the clock signal CK are applied to a combinatory network 2A comprising the exclusive-OR gate 24 and the inverter 25. The clock signal CK is applied to the gate 24 and inverter 25 and the signal I is applied only to the exclusive-OR gate 24. The signals H and $\overline{CK}$ produced by the gate 24 and inverter 25 respectively (FIG. 2b) constitute the first and the second signals of the combinatory network. The first and the second signals H and $\overline{CK}$ are applied through the two resistors R21 and R22 to the junction S as a result of which a control signal S2 (FIG. 2b) is produced for the voltage-controlled oscillator VCO (not shown in FIG. 2a).

When the clock pulses and the input pulses are in phase, the control-signal S2 is again formed by a direct voltage lying midway between the logical "0" and the logical "1" level. By means of the ratio between the values of R21 and R22 the direct voltage level of S2 can be adjusted. When the oscillator is leading (in FIG. 2b before instant $t_2$) "negative" pulses (logical "0" level) are formed on the direct voltage level of the signal S2. When the oscillator is lagging (in FIG. 2b after the instant $t_2$), "positive" pulses (logical "1") are formed on the direct voltage level of S2. The width of the negative or positive pulses is determined by the phase difference between the input pulses A and the clock pulses CK.

As is indicated by a broken line a capacitor 26 can be connected in a conventional manner to the junction S so that across the capacitor 26 a time average of the signal S2 is formed by which the voltage-controlled oscillator is controlled.

Figure 3A:
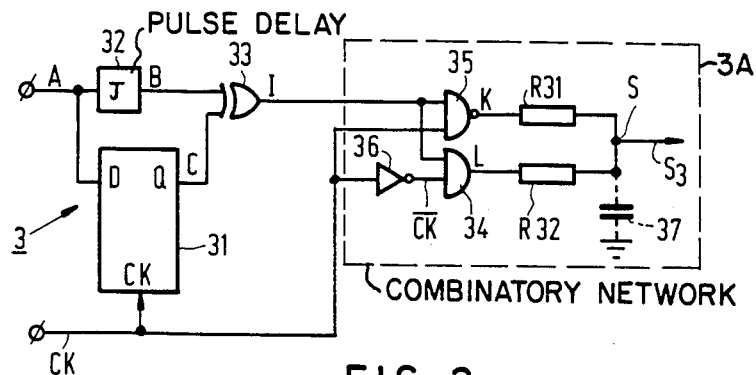
FIG. 3a and 3b are similar diagrams of a preferred embodiment with an associated pulse diagram in accordance with the invention.
Figure 3B:
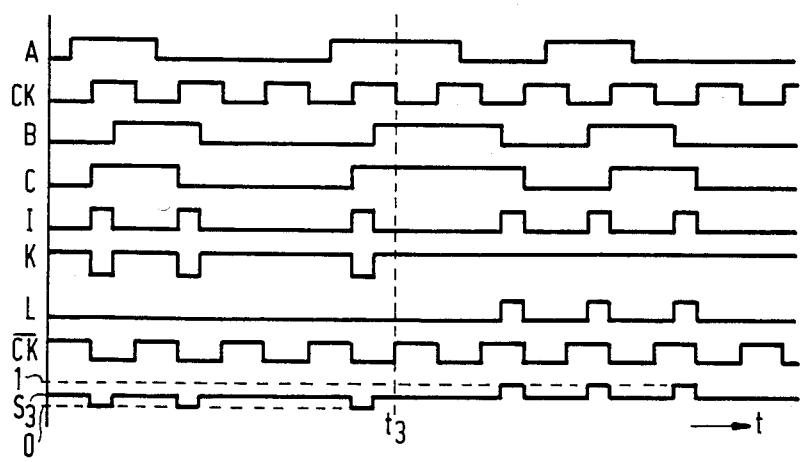

FIG. 3a shows a preferred embodiment of a phase comparator 3 for use in a circuit arrangement in accordance with the invention. The input pulses A to be applied to the phase comparator 3 need not necessarily form a regular periodic signal. The phase comparator 3 comprises a D type flipflop 31, a pulse delaying element 32, an exclusive-OR gate 33 and a combinatory network itself comprising an AND gate 34, an inverting AND gate 35 and an inverter 36. The D flipflop 31, the delaying element 32 and the exclusive-OR gate 33 are identical to the components shown in FIG. 2a as well as the clock and input pulses CK and A applied thereto so that the output signal I of the exclusive-OR gate 33 (see FIG. 3b) is the same as the signal I of FIG. 2b and FIG. 2a. The signal I is applied to the two AND gates 34 and 35 and the clock pulses CK are applied directly to the inverter 36, and through the inverter 36 to the AND gate 34. The AND gates produce therefrom a first and a second signal K and L of the combinatory network 3A (see FIG. 3b), which are applied through two (identical) resistors R31 and R32 to the junction S and produce a control signal S3. It should be noted that the first signal K has a constant, logical high "1" level, when the oscillator (not shown) is lagging (after the instant $t_3$, FIG. 3b) and has negative pulses (logical "0" level) when the oscillator is leading (FIG. 3b prior to instant $t_3$). The second signal L has a constant logical "0" level when the oscillator is leading (prior to instant $t_3$ in FIG. 3b) and when the oscillator is lagging (after $t_3$), the second signal has positive pulses (logical "1" level). The control-signal S3 (half the sum of the output signals K and L) produced at the junction is the same as the control signal S2 (see FIGS. 2a and 2b). Of course, also in this case a time average of the control signal S3 is obtained with the aid of a capacitor 37 for controlling the oscillator.

Figure 4:
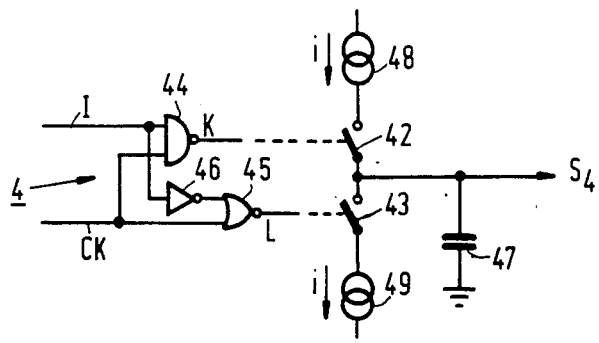
FIG. 4 is a detail diagram of a further embodiment in accordance with the invention.

FIG. 4 shows an embodiment of a combinatory network 4 to be used in the phase comparator of FIG. 3. The network 4 receives the signals I and CK (see FIGS. 3a and 3b) and comprises two inverting gates 44, 45 and an inverter 46. The clock pulses CK are applied to the inverting AND gate 44 as well as to the inverting OR gate 45. The I signal is applied directly to the inverter AND gate 44 and via the inverting 46 to the inverting OR gate. From the incoming signals I and CK the gates 44 and 45 produce a first and a second signal K and L, which are identical to the output signals K and L of FIGS. 3a and 3b. The signals K and L of FIG. 4 could, therefore, be joined to form a control signal in the same manner as is indicated in FIG. 3a. FIG. 4 shows a variant in which the ("negative") and the ("positive") pulses in the signals K and L control switches 42 and 43 respectively. Through the switch 42 or the switch 43 a capacitor 47 is charged or discharged by a current i supplied by a current source 48 or a current source 49. The control signal S4 built up across the capacitor 47 is again the time-mean signal of the control signal S3 shown in FIG. 3b.

What is claimed is:

1. An electric circuit comprising a voltage-controlled oscillator having an output;
   means for connecting to said oscillator output to provide clock pulses; and
   a phase comparator having a clock input, a further input for receiving a train of input pulses, and means for producing a control signal for said oscillator responsive to a phase relationship between said clock pulses and said train of input pulses,
   characterized in that said comparator comprises a single exclusive-OR gate for receiving delayed input pulses, having two inputs,
   a single D-type flipflop only, having an output connected to one of said exclusive-OR gate inputs, and a clock input to which said clock pulses are applied, and
   means for providing a pulse train to the other of said gate inputs, having a delay time of approximately half a clock period with respect to said train of input pulses; and
   said means for producing comprises a combinatory network having two network inputs, an output of said single exclusive-OR gate being connected to one of said network inputs,
   said combinatory network comprising means for forming a first and a second signal which have respectively opposite logic values when the clock pulses and input pulses are in phase, and which during a portion of each clock cycle have a same logical value when said clock pulses and input pulses are not in phase, the duration of said portion being a function of the magnitude of the difference in phase between said clock and input pulses, and the sense of the logical value being responsive to the sense of the phase difference.

2. A circuit as claimed in claim 1, characterized in that said means for providing comprises a pulse delaying element having an output connected to said one of said exclusive-OR gate inputs, the output of said flipflop being connected to the other of said exclusive-OR gate inputs,
   said train of input pulses being applied both to said pulse delaying element and to the D input of the D-type flipflop.

3. A circuit as claimed in claim 2, characterized in that said combinatory network comprises a second exclusive-OR gate and an inverter, one input of the second exclusive-OR gate being connected to the output of said single exclusive-OR gate, and the other input of the second exclusive-OR gate receiving the clock pulses,
   said clock pulses also being applied to the inverter, the outputs of said second exclusive-OR gate and said inverter being said first and second signals.

4. A circuit as claimed in claim 1, characterized in that said combinatory network comprises an inverting AND gate, a further AND gate and an inverter, a first input of each of said AND gates being connected to the output of the exclusive-OR gate, a second input of one of said AND gates receiving the clock pulses directly, the second input of the other of said AND gates receiving the clock pulses via the inverter, said first and second signals being obtained from the respective outputs of said AND gates.

5. A circuit as claimed in claim 1, characterized in that said combinatory network comprises an inverting AND gate, an inverting OR gate, and an inverter; the output of the exclusive-OR gate being connected directly to one input of one of said inverting gates, and indirectly through said inverter to one input of the other of said inverting gates; the other input of each inverting gate receiving said clock pulses; and the first and second signals being obtained from the outputs of the respective inverting gates.

6. A circuit as claimed in claim 5, characterized in that said combinatory network comprises first and second current sources, a capacitor, and means for controlling said first and second current sources respectively by said first and second signals for charging and discharging said capacitor, said control signal being obtained from said capacitor.

7. An electric circuit comprising a voltage-controlled oscillator having an output;
   means for connecting to said oscillator output to provide clock pulses; and
   a phase comparator having a clock input, a further input for receiving a train of input pulses, and means for producing a control signal for said oscillator responsive to a phase relationship between said clock pulses and said train of input pulses,
   characterized in that said comparator comprises a single exclusive-OR gate having two inputs, and
   a single D-type flipflop only, having a clock input to which said clock pulses are applied, the flipflop inverted output signal $\bar{Q}$ being connected directly to the D input of the flipflop, and the flipflop output signal Q being connected to an input of said exclusive-OR gate, the other input of said exclusive-OR gate receiving said train of input pulses;
   said means for producing comprises a combinatory network having two network inputs, an output of said single exclusive-OR gate being connected to one of said network inputs, and
   said combinatory network comprises means for forming a first and a second signal which have respectively opposite logic values when the clock pulses and input pulses are in phase, and which during a portion of each clock cycle have a same logical value when said clock pulses and input pulses are not in phase, the duration of said portion being a function of the magnitude of the difference in phase between said clock and input pulses, and the sense of the logical value being responsive to the sense of the phase difference, said first and second signals being the output of the exclusive-OR and the clock pulses respectively; when said clock pulses are synchronized to said train of input pulses, the logical values of said first and second signals being exactly opposite; and when the clock pulses are not synchronized to said train of input pulses, said first and second signals having the same logical value during a portion of each clock pulse cycle.

8. A circuit as claimed in any of claims 1, 2, 3, 4 or 7, characterized in that said combinatory network comprises first and second resistors having respective first ends to which said first and second signals are applied respectively, each of said resistors having a second end connected to a junction at which said control signal is available.

* * * * *